United States Patent
Rasheed et al.

(10) Patent No.: US 9,914,999 B2
(45) Date of Patent: Mar. 13, 2018

(54) OXIDIZED SHOWERHEAD AND PROCESS KIT PARTS AND METHODS OF USING SAME

(71) Applicant: APPLIED MATERIALS, INC., Santa Clara, CA (US)

(72) Inventors: Muhammad M. Rasheed, San Jose, CA (US); Balasubramanian Ramachandran, Santa Clara, CA (US); Shih Chung Chen, Cupertino, CA (US); Kevin A. Papke, Portland, OR (US); Lei Zhou, Santa Clara, CA (US); Jing Zhou, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 253 days.

(21) Appl. No.: 14/750,322

(22) Filed: Jun. 25, 2015

(65) Prior Publication Data

US 2016/0319428 A1 Nov. 3, 2016

Related U.S. Application Data

(60) Provisional application No. 62/153,790, filed on Apr. 28, 2015.

(51) Int. Cl.
  *C23C 16/455* (2006.01)
  *C23C 16/44* (2006.01)

(52) U.S. Cl.
  CPC .... *C23C 16/45544* (2013.01); *C23C 16/4404* (2013.01); *C23C 16/45565* (2013.01)

(58) Field of Classification Search
  CPC .......... C23C 16/45544; C23C 16/4404; C23C 16/45565
  USPC ........................................ 118/715; 156/345.1
  See application file for complete search history.

(56) References Cited

U.S. PATENT DOCUMENTS

| | | | | | |
|---|---|---|---|---|---|
| 5,968,379 | A | * | 10/1999 | Zhao | C23C 16/45565 118/723 I |
| 6,095,083 | A | * | 8/2000 | Rice | H01J 37/32706 118/715 |
| 6,474,570 | B2 | * | 11/2002 | Chen | C23C 16/455 239/390 |
| 6,616,767 | B2 | * | 9/2003 | Zhao | C23C 16/45565 118/725 |

(Continued)

*Primary Examiner* — Rudy Zervigon
(74) *Attorney, Agent, or Firm* — Moser Taboada; Alan Taboada

(57) ABSTRACT

Methods and apparatus for processing a substrate are provided herein. In some embodiments, a process chamber includes: a chamber body and a lid assembly defining a processing volume within the process chamber; a substrate support disposed within the processing volume to support a substrate; and a showerhead having a first surface including a plurality of gas distribution holes disposed opposite and parallel to the substrate support, wherein the showerhead is fabricated from aluminum and includes an aluminum oxide coating along the first surface, wherein the aluminum oxide coating has a thickness of about 0.0001 to about 0.002 inches. In some embodiments, the showerhead may further have at least one of a roughness of about 10 to about 300 μ-in Ra, or an emissivity (∈) of about 0.20 to about 0.80. The process chamber may be a thermal atomic layer deposition (ALD) chamber.

18 Claims, 2 Drawing Sheets

(56) References Cited

U.S. PATENT DOCUMENTS

| | | | |
|---|---|---|---|
| 7,895,970 B2* | 3/2011 | Honda | F02M 27/042 |
| | | | 118/723 E |
| 8,083,891 B2* | 12/2011 | Sato | H01L 21/67069 |
| | | | 118/715 |
| 8,282,734 B2* | 10/2012 | Padhi | C23C 16/0254 |
| | | | 118/45 |
| 8,955,547 B2 | 2/2015 | Gungor et al. | |
| 2002/0084352 A1* | 7/2002 | Chen | C23C 16/455 |
| | | | 239/390 |
| 2002/0192370 A1* | 12/2002 | Metzner | C23C 16/407 |
| | | | 427/248.1 |
| 2004/0129211 A1* | 7/2004 | Blonigan | C23C 16/455 |
| | | | 118/715 |
| 2007/0295272 A1* | 12/2007 | Padhi | C23C 16/0254 |
| | | | 118/715 |
| 2008/0169183 A1* | 7/2008 | Hertel | H01J 37/32412 |
| | | | 204/164 |
| 2009/0179085 A1* | 7/2009 | Carducci | C23C 16/4412 |
| | | | 239/289 |
| 2010/0288197 A1* | 11/2010 | Choi | C23C 16/4404 |
| | | | 118/723 R |
| 2013/0098477 A1 | 4/2013 | Yudovsky et al. | |
| 2015/0053794 A1* | 2/2015 | Carducci | C23C 16/4412 |
| | | | 239/548 |
| 2015/0376760 A1* | 12/2015 | Naim | C23C 4/11 |
| | | | 428/34.4 |
| 2016/0258064 A1* | 9/2016 | Pareek | C23C 14/564 |
| 2016/0319428 A1* | 11/2016 | Rasheed | C23C 16/45544 |
| 2017/0011909 A1* | 1/2017 | White | H01L 21/02271 |

* cited by examiner

OXIDIZED SHOWERHEAD AND PROCESS KIT PARTS AND METHODS OF USING SAME

CROSS-REFERENCE TO RELATED APPLICATIONS

This application claims benefit of U.S. provisional patent application Ser. No. 62/153,790, filed Apr. 28, 2015, which is herein incorporated by reference in its entirety.

FIELD

Embodiments of the disclosure generally relate to methods and apparatus for substrate processing, and more particularly, for atomic layer deposition processes.

BACKGROUND

Atomic layer deposition (ALD) is a deposition technique used for the deposition of material layers over features formed on substrates. One example of an ALD process includes the sequential introduction of pulses of gases. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. Sequential introduction of separate pulses of the first reactant and the second reactant may result in the alternating self-limiting absorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

However, the inventors have observed that some ALD processes undesirably produce high particle contamination of the substrate. The inventors believe that the particle contamination is resultant from deposition of materials on chamber components exposed to the process chemistry and that have direct line of sight to the substrate. To minimize or eliminate the particle contamination, more frequent cleaning of the affected chamber components would be required, undesirably resulting in a very short mean time between cleaning (MTBC) of these chamber components.

Therefore, the inventors have provided improved apparatus and methods for ALD processing of a substrate.

SUMMARY

Methods and apparatus for processing a substrate are provided herein. In some embodiments, a process chamber includes: a chamber body and a lid assembly defining a processing volume within the process chamber; a substrate support disposed within the processing volume to support a substrate; and a showerhead having a first surface including a plurality of gas distribution holes disposed opposite and parallel to the substrate support, wherein the showerhead is fabricated from aluminum and includes an aluminum oxide coating along the first surface, wherein the aluminum oxide coating has a thickness of about 0.0001 to about 0.002 inches. In some embodiments, the showerhead may further have at least one of a roughness of about 10 to about 300 µ-in Ra, or an emissivity ($\in$) of about 0.20 to about 0.80. In some embodiments, the process chamber may be a thermal atomic layer deposition (ALD) chamber.

In some embodiments, a process chamber includes: a chamber body and a lid assembly defining a processing volume within the process chamber; a liner disposed along sidewalls of the chamber body; a substrate support disposed within the processing volume to support a substrate; an edge ring disposed atop the substrate support; and a showerhead having a first surface including a plurality of gas distribution holes disposed opposite and parallel to the substrate support, wherein the showerhead, the liner, and the edge ring are fabricated from aluminum and include an aluminum oxide coating having a thickness of about 0.0001 to about 0.002 inches. In some embodiments, the showerhead, the liner, and the edge ring further have a roughness of about 10 to about 300 µ-in Ra. In some embodiments, the showerhead, the liner, and the edge ring further have an emissivity ($\in$) of about 0.20 to about 0.80. In some embodiments, the process chamber may be a thermal atomic layer deposition (ALD) chamber.

In some embodiments, a component for a process chamber includes: at least one of a liner configured to be disposed along sidewalls of the process chamber, an edge ring configured to be disposed atop a substrate support disposed within the process chamber, a showerhead having a first surface including a plurality of gas distribution holes, or a spacer configured to control a position of the showerhead within the process chamber when disposed in the process chamber, wherein the at least one of the liner, edge ring, showerhead, or spacer are fabricated from aluminum and include an aluminum oxide coating having a thickness of about 0.0001 to about 0.002 inches.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, that the appended drawings illustrate only typical embodiments of the disclosure and are therefore not to be considered limiting of scope, for the disclosure may admit to other equally effective embodiments.

Figure 1:
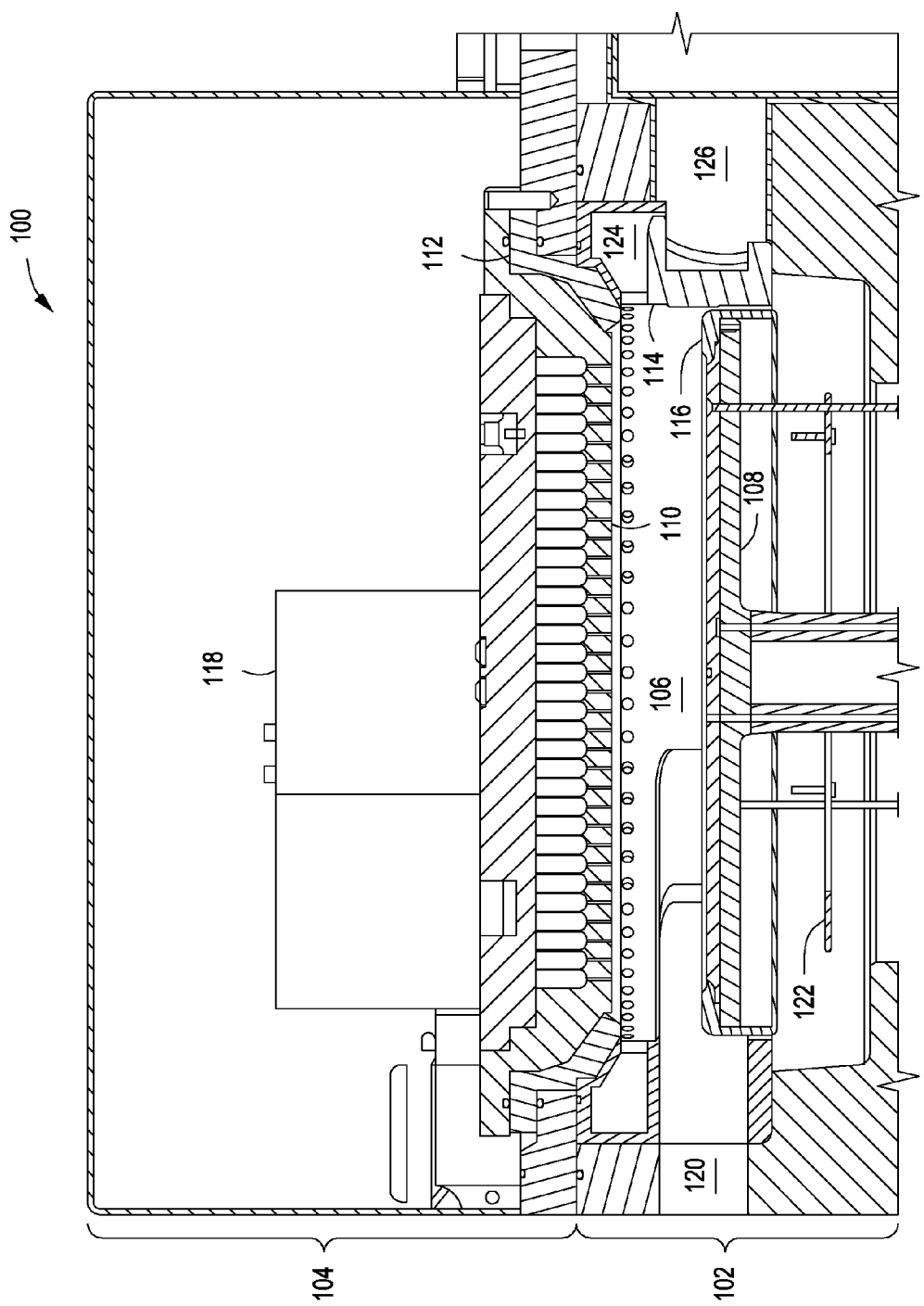
FIG. 1 depicts a schematic side cross-sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide apparatus and methods that may be used to process substrates, such as by using atomic layer deposition (ALD) processes (although process chambers for performing other processes may also benefit from the teachings disclosed herein). Embodiments include substrate processing chambers having internal components having improved adhesion to materials deposited during substrate processing, leading to lengthened mean time between cleaning and improved chamber uptime. Examples of suitable processing chambers for incorporation of the teachings described herein include high dielectric constant (i.e., high k) and metal ALD deposition chambers available from Applied Materials, Inc., of Santa Clara, Calif., although other chambers available from other manufacturers may also benefit. The following process chamber description is provided for context and exemplary purposes, and should not be construed as limiting the scope of the disclosure.

For example, the inventors have observed that undesirable particle generation can be limited, and the mean time between cleaning of process chamber components extended, during deposition of titanium aluminum, titanium nitride, or tungsten layers, for example, via ALD processes. In some embodiments, the film deposition is a thermal process and is not plasma-assisted. For example, in some embodiments, the film deposition is a thermal ALD process.

FIG. 1 is a schematic view of a substrate processing chamber (process chamber 100) in accordance with some embodiments of the present disclosure. Process chamber 100 includes a chamber body 102 and a lid assembly 104 having a processing volume 106 defined within the chamber body 102 and beneath the lid assembly 104. A slit valve 120 in the chamber body 102 provides access for a robot (not shown) to deliver and retrieve a substrate, such as a 200, 300, 450 mm or the like semiconductor wafer, a glass substrate, or the like, to and from the process chamber 100.

A substrate support 108 supports a substrate on a substrate receiving surface in the process chamber 100. The substrate support 108 is mounted to a lift motor for raising and lowering the substrate support 108 and the substrate when disposed on the substrate support 108. A lift plate 122, connected to a lift motor, is mounted in the process chamber 100 to raise and lower lift pins movably disposed through the substrate support 108. The lift pins raise and lower the substrate over the surface of the substrate support 108. The substrate support 108 may include a vacuum chuck (not shown), an electrostatic chuck (not shown), or a clamp ring (not shown) for securing the substrate to the substrate support 108 during processing.

The temperature of the substrate support 108 may be adjusted to control the temperature of the substrate. For example, substrate support 108 may be heated using an embedded heating element, such as a resistive heater, or may be heated using radiant heat, such as heating lamps configured to provide heat energy to the substrate support 108.

In some embodiments, an edge ring 116 may be disposed atop a peripheral edge of the substrate support 108. The edge ring 116 includes a central opening sized to expose the support surface of the substrate support 108. The edge ring 116 may further include a skirt, or downwardly extending annular lip to protect the sides of the substrate support 108.

In some embodiments, a liner 114 is disposed along the interior walls (e.g., one or more sidewalls) of the chamber body 102 to protect the chamber body 102 from corrosive gases or deposition of materials during operation. In some embodiments, the liner 114 includes an inner volume 124 and a plurality of openings to fluidly couple the inner volume 124 to the processing volume 106. In such embodiments, the inner volume 124 of the liner 114 is further fluidly coupled to a pumping channel 126 to facilitate evacuation of gases from the process chamber 100 and maintaining a predetermined pressure or pressure range inside the process chamber 100 via a vacuum pump coupled to the pumping channel 126.

A gas delivery system 118 is coupled to the lid assembly 104 to provide a gas, such as a process gas and/or a purge gas, to the processing volume 106 through a showerhead 110. The showerhead 110 is disposed in the lid assembly 104 generally opposite the substrate support 108 and includes a plurality of gas distribution holes to provide process gases to the processing volume 106. In some embodiments, a spacer 112 may be provided to control the position of the showerhead 110 with respect to the substrate support 108 (e.g., the distance between the front face of the showerhead 110 and the support surface of the substrate support 108). For example, in some embodiments, the spacer 112 may be an annular member disposed between the showerhead 110 and a support member in the lid assembly 104. The dimensions of the spacer 112, for example the thickness, may be selected to control the position of the showerhead 110 when resting atop the spacer 112.

Figure 2:
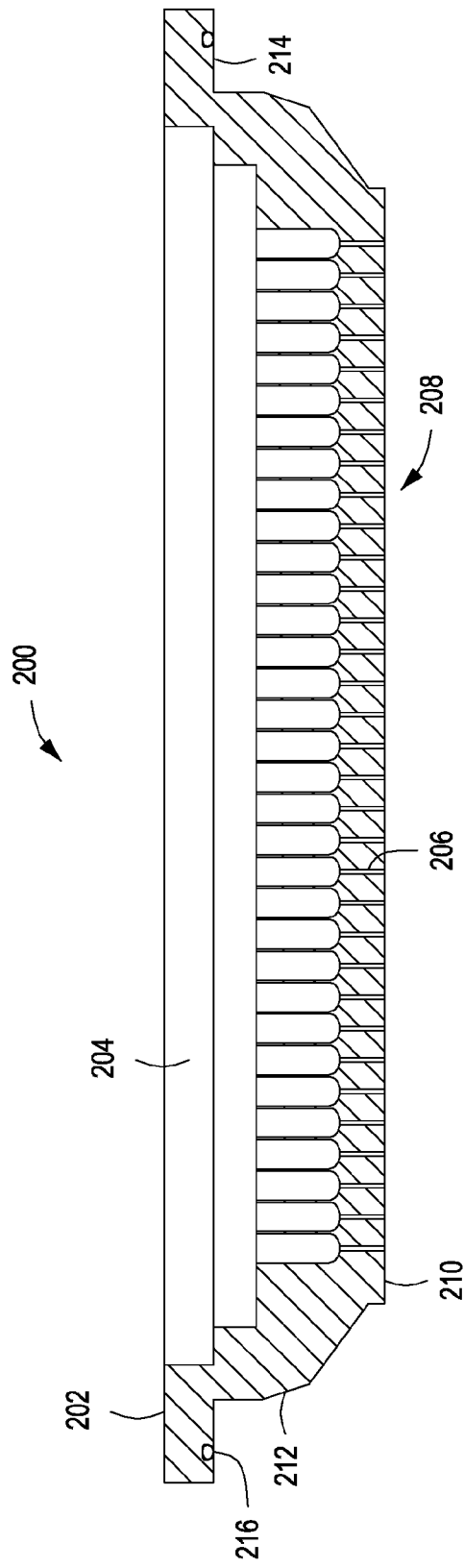
FIG. 2 depicts a schematic side cross-sectional view of a showerhead for a process chamber in accordance with some embodiments of the present disclosure.

FIG. 2 depicts a schematic side cross-sectional view of an illustrative showerhead 200 for a process chamber in accordance with some embodiments of the present disclosure. The showerhead 200 may be used as the showerhead 110 of FIG. 1. As depicted in FIG. 2, the showerhead 200 generally includes a body 202 having a plenum 204 disposed within the body 202 and a plurality of gas distribution holes 206 extending through the body 202 from the plenum 204 to a processing volume facing side 208 of the body 202. The processing volume facing side 208 of the body 202 may be defined by a first surface 210, a side 212, and a radially outwardly extending flange 214. The first surface 210 includes the gas distribution holes 206 and is typically held generally parallel to and opposite the substrate support. The radially outwardly extending flange 214 facilitates mounting the showerhead 200 to some process chamber component, such as the lid assembly 104 disclosed in FIG. 1. A groove 216 may be formed in the radially outwardly extending flange 214 to receive a gasket, such as an o-ring, to facilitate providing a seal between the showerhead 200 and the process chamber component to which the showerhead 200 is mounted. Although a particular configuration of showerhead 200 is shown, details such as the shape of the body 202, configuration of the plenum 204, configuration of the plurality of gas distribution holes 206, or the like, may be varied while not departing from teachings of the present disclosure.

Returning to FIG. 1, one or more internal surfaces of the process chamber 100 may include a coating to improve adhesion of materials deposited on the internal surfaces and reduce particle formation due to flaking of the deposited materials. Internal surfaces of the process chamber 100 include surfaces defining the processing volume 106 or that are exposed to the gases provided to the processing volume 106 during operation of the process chamber 100. For example, in some embodiments, one or more of the showerhead 110, spacer 112, liner 114, or edge ring 116 may include a coating to improve adhesion of materials deposited on the aforementioned components. Components of the process chamber 100 that are exposed to the processing volume and which undergo periodic maintenance and/or replacement over time are referred to herein as process kit parts. Process kit parts include, but are not limited to, the spacer 112, the liner 114, and the edge ring 116.

For example, the one or more internal surfaces of the process chamber 100, such as the showerhead and process kit parts, may be fabricated from aluminum and may include an aluminum oxide coating. The aluminum oxide coating may be formed by anodization, clear anodization, an oxalic coating, plasma spray coating, or a thick native oxide coating. The aluminum oxide coating may have a thickness of about 0.0001 to about 0.002 inches. The inventors have unexpectedly discovered that although providing the aluminum oxide coating to a certain thickness improved adhesion, thicker aluminum oxide coatings did not perform as well in certain applications. As such, in some embodiments, the thickness of the aluminum oxide coating should be limited to no more than about 0.002".

In some embodiments, film adhesion is further improved by texturizing the showerhead and process kit parts to a roughness of about 10 to about 300 µ-in Ra, or in some embodiments to about 50 to about 300 µ-in Ra. The surface of the showerhead and process kit parts can be texturized prior to applying or growing the aluminum oxide coating, for example, by grit blasting or the like.

For certain applications, the inventors have discovered that providing a surface roughness to the showerhead or process kit parts without the aluminum oxide coating is not sufficient for good film adhesion over the life of the components. The inventors have discovered, however, that the improved film adhesion provided by the aluminum oxide coating on the showerhead and the process kit parts can be further improved by addition of the texturizing of the aluminum surface in combination with the aluminum oxide coating. Specifically, without wishing to be bound by theory, the inventors believe the combination of macro roughness from pre-texturizing with micro roughness from the aluminum oxide coating unexpectedly provides improved adhesion properties not provided by either the texturizing or aluminum oxide coating alone.

In some embodiments, if the aluminum oxide coating is grown by anodization or oxalic coating, a water seal may be provided to reduce micro pores in the columnar structure of the aluminum oxide coating.

The one or more internal surfaces of the process chamber 100, such as the showerhead and process kit parts, may further have an emissivity ($\in$) of about 0.20 to about 0.80. The emissivity may be controlled by a combination of the thickness and the roughness of the aluminum oxide coating. Providing an emissivity in the disclosed range advantageously reduces the number of substrate required for burn-in or seasoning of the internal surfaces of the process chamber 100 prior to deposition of, for example, a titanium aluminum film via an ALD process.

Providing the one or more internal surfaces of the process chamber 100, such as the showerhead and process kit parts, with the aluminum oxide coating and optionally, roughness in the disclosed range advantageously provides improved film adhesion throughout the component life (as compared to components not having the aluminum oxide coating and optionally the roughness). In addition, the aluminum oxide coating provides better corrosion resistance to halide-based precursors used in many substrate processing applications (such as ALD). In some embodiments, the aluminum oxide coating can provide better emissivity control to provide process stability from the beginning of the component life, for example, in a thermal ALD process. In some embodiments, where process precursors are hydrocarbon-based aluminum- and chlorine-based titanium (Ti) or tantalum (Ta), process kit parts, specifically the showerhead, liner, and spacer ring may have an anodized aluminum oxide coating having a thickness of about 0.0001" to about 0.0002", a surface roughness of about 10 to about 100 µ-in Ra, and an emissivity ($\in$) of about 0.20 to about 0.80.

In an illustrative processing operation, a substrate is delivered to the process chamber 100 through the slit valve 120 by a robot (not shown). The substrate is positioned on the substrate support 108 through cooperation of the lift pins and the robot. The substrate support 108 raises substrate into close opposition to a lower surface of the showerhead 110. A first gas flow may be injected into the processing volume 106 by the gas delivery system 118 together or sequentially (e.g., in pulses) with a second gas flow. The first gas flow may contain a continuous flow of a purge gas from a purge gas source and pulses of a reactant gas from a reactant gas source or may contain pulses of a reactant gas from the reactant gas source and pulses of a purge gas from the purge gas source. The second gas flow may contain a continuous flow of a purge gas from a purge gas source and pulses of a reactant gas from a reactant gas source or may contain pulses of a reactant gas from a reactant gas source and pulses of a purge gas from a purge gas source. The gas is then deposited on the surface of substrate. Excess gas, by-products, and the like flow through the inner volume 124 of the liner 114 to the pumping channel 126 and are then exhausted from process chamber 100.

Over the course of processing, materials may be deposited on the internal surfaces of the process chamber 100. As such, the apparatus as disclosed herein advantageously improves adhesion of the deposited materials to the internal surfaces, such as to the showerhead and process kit parts, thus reducing particle generation due to flaking of the deposited materials.

While the foregoing is directed to some embodiments of the present disclosure, other and further embodiments may be devised without departing from the basic scope thereof.

What is claimed is:

1. A process chamber, comprising:
    a chamber body and a lid assembly defining a processing volume within the process chamber;
    a substrate support disposed within the processing volume to support a substrate;
    a showerhead having a first surface including a plurality of gas distribution holes disposed opposite and parallel to the substrate support, wherein the showerhead is fabricated from aluminum and includes an aluminum oxide coating on the first surface at least between the plurality of gas distribution holes, wherein the aluminum oxide coating has a thickness of about 0.0001 to about 0.002 inches; and
    at least one of a spacer disposed between the showerhead and the lid assembly to control the position of the showerhead within the process chamber; a liner disposed along sidewalls of the chamber body; or an edge ring disposed atop the substrate support, wherein at least one of the spacer, the liner, or the edge ring is fabricated from aluminum and includes an aluminum oxide coating, wherein the aluminum oxide coating has a thickness of about 0.0001 to about 0.002 inches, and wherein the aluminum of the at least one of the spacer, the liner, or the edge ring has a surface roughness of about 10 to about 300 µ-in Ra.

2. The process chamber of claim 1, wherein the aluminum of the showerhead has a surface roughness of about 10 to about 300 µ-in Ra.

3. The process chamber of claim 1, wherein the aluminum of the showerhead has a surface roughness of about 50 to about 300 µ-in Ra.

4. The process chamber of claim 1, wherein the showerhead further has an emissivity ($\in$) of 0.20 to 0.80.

5. The process chamber of claim 1, wherein the aluminum of the at least one of the spacer, the liner, or the edge ring has a surface roughness of about 50 to about 300 μ-in Ra.

6. The process chamber of claim 1, wherein the at least one of the spacer, the liner, or the edge ring further has an emissivity (∈) of about 0.20 to about 0.80.

7. The process chamber of claim 1, wherein the process chamber is a thermal atomic layer deposition (ALD) chamber.

8. A process chamber, comprising:
a chamber body and a lid assembly defining a processing volume within the process chamber;
a liner disposed along sidewalls of the chamber body;
a substrate support disposed within the processing volume to support a substrate;
an edge ring disposed atop the substrate support; and
a showerhead having a first surface including a plurality of gas distribution holes disposed opposite and parallel to the substrate support,
wherein at least one of the showerhead, the liner, or the edge ring are fabricated from aluminum and include an aluminum oxide coating having a thickness of about 0.0001 to about 0.002 inches, and
wherein the aluminum of the at least one of the showerhead, the liner, or the edge ring have a surface roughness of about 10 to about 300 μ-in Ra.

9. The process chamber of claim 8, wherein the at least one of the showerhead, the liner, or the edge ring have a water seal on the aluminum oxide coating.

10. The process chamber of claim 8, wherein the aluminum of the at least one of the showerhead, the liner, or the edge ring have a surface roughness of about 50 to about 300 μ-in Ra.

11. The process chamber of claim 8, wherein the at least one of the showerhead, the liner, or the edge ring further have an emissivity (∈) of about 0.20 to about 0.80.

12. The process chamber of claim 8, wherein the process chamber is a thermal atomic layer deposition (ALD) chamber.

13. The process chamber of claim 8, further comprising a spacer disposed between the showerhead and the lid assembly to control the position of the showerhead within the process chamber, wherein the spacer is fabricated from aluminum and include an aluminum oxide coating having a thickness of about 0.0001 to about 0.002 inches.

14. The process chamber of claim 13, wherein the spacer further has at least one of a roughness of about 10 to about 300 μ-in Ra or an emissivity (∈) of about 0.20 to about 0.80.

15. A component for a process chamber, comprising:
at least one of a liner configured to be disposed along sidewalls of the process chamber, an edge ring configured to be disposed atop a substrate support disposed within the process chamber, a showerhead having a first surface including a plurality of gas distribution holes, or a spacer configured to control a position of the showerhead within the process chamber when disposed in the process chamber, wherein the at least one of the liner, edge ring, showerhead, or spacer are fabricated from aluminum and include an aluminum oxide coating having a thickness of about 0.0001 to about 0.002 inches and wherein the aluminum of the at least one of the showerhead, the liner, or the edge ring have a surface roughness of about 10 to about 300 μ-in Ra.

16. The component for a process chamber of claim 15, wherein the at least one of the liner, edge ring, showerhead, or spacer have a water seal on the aluminum oxide.

17. The component for a process chamber of claim 15, wherein the aluminum of the at least one of the liner, edge ring, showerhead, or spacer have a surface roughness of about 50 to about 300 μ-in Ra.

18. The component for a process chamber of claim 15, wherein the at least one of the liner, edge ring, showerhead, or spacer further have an emissivity (∈) of about 0.20 to about 0.80.

* * * * *